United States Patent [19]

Harvey

[11] Patent Number: 5,321,371

[45] Date of Patent: Jun. 14, 1994

[54] CURRENT MIRROR WITH ERROR CORRECTION

[75] Inventor: Barry Harvey, Los Altos, Calif.

[73] Assignee: Elantec, Inc., Milpitas, Calif.

[21] Appl. No.: 115,430

[22] Filed: Sep. 1, 1993

[51] Int. Cl.⁵ .............................................. H03F 3/04
[52] U.S. Cl. ..................................... 330/288; 330/296
[58] Field of Search ............... 330/288, 290, 296, 311; 323/315, 316; 307/296.1

[56] References Cited

U.S. PATENT DOCUMENTS 4,766,396 8/1988 Taya et al. .......................... 330/288

Primary Examiner—Steven Mottola
Attorney, Agent, or Firm—Albert C. Smith

[57] ABSTRACT

A current mirror circuit is modified to supply bias current to the input transistor that varies in accordance with variations in the base-emitter voltages of the input and output transistors, and in accordance with the variations in collector voltage of the output transistor. The bias current variations are controlled by a pair of complementary conductivity type transistors that are closely coupled in manner similar to the coupling of the input and output transistors with associated bias supplies and unity gain amplifier connected to alter bias conditions in accordance with variations in the base-emitter voltage and the collector voltage of the output transistor.

3 Claims, 1 Drawing Sheet

CURRENT MIRROR WITH ERROR CORRECTION

FIELD OF INVENTION

This invention relates to current mirror circuits and more particularly to such circuits with compensation for deviations in operating conditions that contribute error to the proportionality between output and input currents.

BACKGROUND OF THE INVENTION

Current mirror circuits are commonly used in circuit applications that require an output current level that remains proportional to the level of input current. Such circuits after include complementary conductivity type transistors connected in close-coupled relationship that rely upon the base-emitter voltage drops being substantially equal but of opposite polarity to cancel out in normal operation. However, error results from variations of the base-emitter voltage of one transistor of one conductivity type relative to the base-emitter voltage of the other transistor of opposite conductivity type. In addition, the Early effect (i.e., modulation of the width of the base region as a function of collector voltage) can cause modulation of the base-emitter voltage of one transistor relative to the modulation of the base-emitter voltage of the other transistor. Further, thermal variations attributable to different heat dissipation in the transistors can modulate the base-emitter voltage of one transistor relative to the base-emitter voltage of the other transistor.

SUMMARY OF THE INVENTION

In accordance with the present invention, a source of bias current is introduced into a current mirror circuit to supply bias current that increases or decreases in accordance with the variations in the base-emitter voltages of the two transistors of opposite conductivity types. In addition, variations in the collector voltage of the output transistor are monitored to modulate such bias current to correct the variations in base-emitter voltage of the input transistor in relation to the variations in base-emitter voltage of the output transistor. In this way, the base-emitter voltages of the closely-coupled input and output transistors of opposite conductivity types substantially cancel out to eliminate a source of error in a current mirror circuit.

DESCRIPTION OF THE PREFERRED EMBODIMENT

Figure 1:
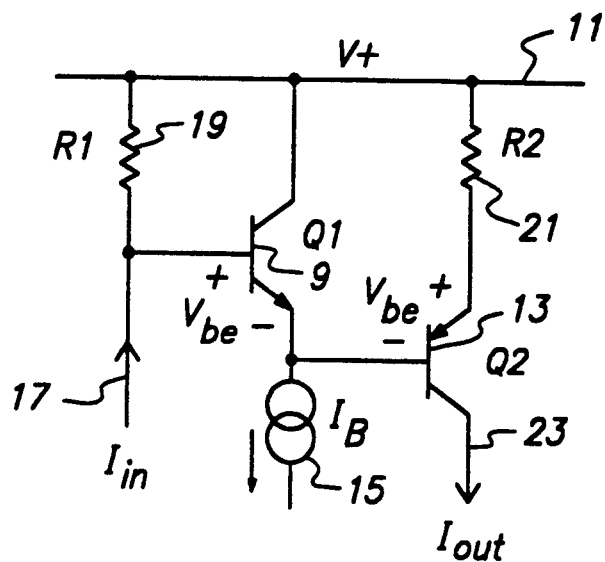
FIG. 1 is a schematic diagram of a conventional current mirror circuit.

Referring now to the schematic diagram of FIG. 1, there is shown a conventional current mirror circuit including an input NPN transistor 9 connected in common collector configuration to a supply 11 of bias voltage, and having an emitter direct coupled to the base of an output PNP transistor 13. A current source 15 of conventional design is connected to the emitter of input transistor 9, and the input current 17 is supplied to the resistor 19 that is connected between the base of the input transistor 9 and the supply 11 of bias voltage. The emitter of the output transistor 13 is connected through resistor 21 to the supply 11 of bias voltage, and the output current 23 flows in the collector of the output transistor 13. In operation, the input current 17 flows substantially entirely in resistor 19 (less the base current) to form a voltage drop there across relative to the supply 11 of bias voltage, which voltage drop for the voltage polarities and current directions illustrated is applied with a more negative polarity to the base of the input transistor. This voltage drop across resistor 19 is thus applied, less the base-emitter voltage of transistor 9 in one polarity orientation, to the base of output transistor 13. The voltage on the base of the output transistor 13 is applied to resistor 21, less the base-emitter voltage of transistor 13 in the opposite polarity orientation so that the base-emitter voltages of transistors 9 and 13 should essentially cancel, if they remain equal. The voltage appearing across resistor 19 thus substantially equals the voltage appearing across resistor 21 (if the base-emitter voltages remain equal), and the output current in the collector of transistor 13 is substantially equal to the current (less the base current) flowing in the emitter (and in resistor 21 times the ratio of resistances of resistor 19 to resistor 21). Therefore, the output current 23 is substantially equal to the input current 17 times the ratio of resistance values of resistor 19 to resistor 21.

In a conventional current mirror of this type, there are several sources of error or deviation in the ratio of output current to input current as initially determined by the ratio of resistors 19, 21. First, the base-emitter voltage of transistor 13 can vary relative to the base-emitter voltage of transistor 9, and therefore these voltages may not completely cancel out around the circuit loop of resistor 19, transistors 9 and 13, and resistor 21. In addition, the so-called Early effect in transistor 13 can modulate its base-emitter voltage relative to the base-emitter voltage of transistor 9. Further, changes in power dissipation of the transistors 9 and 13 cause thermal variations in the base-emitter voltages of the transistor 9, 13.

Figure 2:
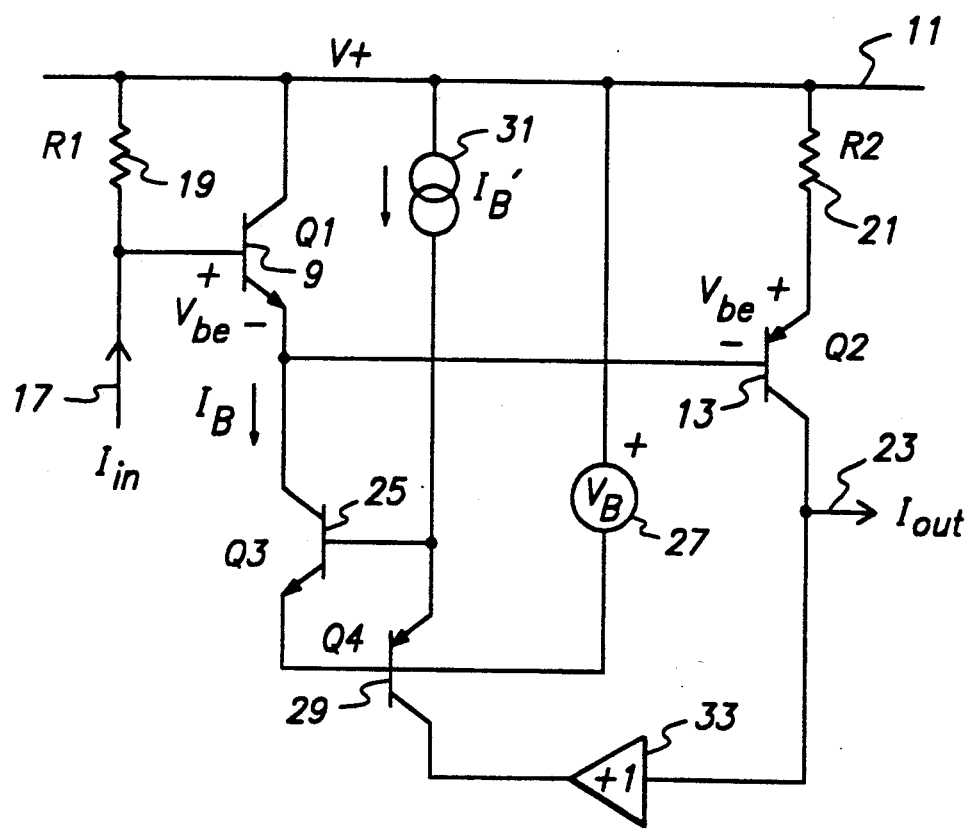
FIG. 2 is a schematic diagram of an embodiment of a current mirror circuit in accordance with the present invention.

These sources of error or variation in base-emitter voltages of the two transistors may be significantly reduced to preserve a static ratio of output current to input current over a wide dynamic operating range using the circuit embodiment of the present invention, as illustrated in FIG. 2. This circuit includes the input and output transistors 9, 13 ($Q_1$, $Q_2$) of opposite conductivity types connected to substantially cancel out the base-emitter voltages in the circuit loop including resistor 19, the two transistors 9, 13, and the resistor 21. However, the bias current $I_B$ flowing substantially entirely in the emitter of the input transistor 9 (less the base current of the output transistor 13) flows in the collector of transistor 25 ($Q_3$) of similar conductivity type to input transistor 9. A source of bias voltage 27 is connected to the emitter of transistor 25 to be maintained at a level of bias voltage relative to the bias supply voltage 11 that is determined by the source 27. In addition, the base of transistor 29 ($Q_4$) of opposite conductivity type is also referenced to the bias supply 11 by the voltage source 27, and its emitter is directly coupled to the base of transistor 25 to receive the current from current source 31. The error in voltage across resistor 21 relative to voltage across resistor 19 is attributable to:

$$V_{be}(Q_2) - V_{be}(Q_1) = V_T \ln \left( \frac{I_B^* \text{Area}(Q_2)^* I_{SP}}{I_{out}^* \text{Area}(Q_1)^* I_{SN}} \right) \quad \text{(Eq. 1)}$$

(ignoring the Early effect) where $I_{SP}$ and $I_{SN}$ are fundamental scale constants of the P-type and N-type transistors, respectively, as follows:

$$I_{col}(N) = \text{Area}(N) I_{SN}^* e^{\frac{qV_{be}(N)}{KT}} \quad \text{(Eq. 2)}$$

$$I_{col}(P) = \text{Area}(P) I_{SP}^* e^{\frac{qV_{be}(P)}{KT}} \quad \text{(Eq. 3)}$$

So:

$$I_{out} \cong I_{in}\left(\frac{R_1}{R_2}\right) + \left(\frac{V_t}{R_2}\right) \ln\left(\frac{I_B^* \text{Area}(Q_2)^* I_{SP}}{I_{out}^* \text{Area}(Q_1)^* I_{SN}}\right) \quad \text{(Eq. 4)}$$

Thus, approximately:

$$\frac{I_B}{I_{B'}} = \frac{I_{SN}^* \text{Area}(Q_3)}{I_{SP}^* \text{Area}(Q_4)} \quad \text{(Eq. 5)}$$

or $$I_B = I_{B'}^* \frac{I_{SN}^* \text{Area}(Q_3)}{I_{SP} \text{Area}(Q_4)} \quad \text{(Eq. 6)}$$

Then:

$$I_{out} = I_{in}\left(\frac{R_1}{R_2}\right) + \quad \text{(Eq. 7)}$$

$$\left(\frac{V_T}{R_2}\right) \ln\left(\frac{I_{B'}}{I_{out}} \cdot \frac{I_{SN}^* \text{Area}(Q_3)}{I_{SP}^* \text{Area}(Q_4)} \cdot \frac{\text{Area}(Q_2)^* I_{SP}}{\text{Area}(Q_1)^* I_{SN}}\right)$$

$$= I_{in}\left(\frac{R_1}{R_2}\right) + \left(\frac{V_T}{R_2}\right) \ln\left(\frac{I_{B'}}{I_{out}} \cdot \frac{\text{Area}(Q_3)^* \text{Area}(Q_2)}{\text{Area}(Q_4)^* \text{Area}(Q_1)}\right) \quad \text{(Eq. 8)}$$

For zero error in $I_{out}$ relative to $I_{in}$:

$$\frac{I_{B'}^* \text{Area}(Q_3)^* \text{Area}(Q_2)}{I_{OUT}^* \text{Area}(Q_4)^* \text{Area}(Q_1)} \cong 1 \quad \text{(Eq. 9)}$$

It should be noted that variations of $I_{SP}$ and $I_{SN}$ that are attributable to manufacturing processes are canceled out. It should also be noted that there is no temperature sensitivity and no processing dependency in the factors that contribute error. Remaining errors attributable to changing $I_{out}$ can be diminished where $I_{out}$ can be maintained relatively constant, and the area and $I_{B'}$ terms can be scaled to reduce errors toward zero.

A typical circuit application connects such a current mirror to the gain node of an amplifier with the resultant $I_{out}$ relatively unchanging, except perhaps for transient waveforms, and the current mirror of the present invention can thus be operated with optimal accuracy.

In addition, the collector-emitter voltage across transistor 29 varies in accordance with variations in the collector-emitter voltage of the output transistor 13 due to the unity-gain amplifier 33 that is coupled from the collector of output transistor 13 to the collector of transistor 29. Thus, the Early effect of modulating the base width (and, hence, the base-emitter voltage) in the output transistor 13 due to collector voltage variations is canceled by similarly modulating the base-emitter voltage in transistor 29 in response to the variations in collector voltage on the output transistor 13 also being imposed on the collector of transistor 29. This affects the base-emitter voltage of transistor 25 which thus alters the bias current, $I_B$, to correctly alter the base-emitter voltage of the input transistor 9 in concert with changes on the base-emitter voltage of the output transmitter 13.

Further, by selecting the thermal resistance of transistor 29 times its bias current, $I_{B'}$, similar to the thermal resistance of the output transistor 13 times its bias current, the thermal variations in voltage across the output transistor will be applied to transistor 29 which, in turn, affects the bias current, $I_B$, in the manner previously described to compensate the input transistor 9 for changes in the output transistor 13. The thermal resistances of the transistors 13 and 29 are substantially proportional to the areas of the respective emitters which can thus be fabricated to provide these matching parameters.

Therefore, the compensation circuit in the present invention introduces another stage of complementary conduction type transistors in the bias circuitry for input and output transistors of a current mirror in order to eliminate sources of variations between the base-emitter voltage of the input transistor and the base-emitter voltage of the output transistor. Bias current supplied to the input transistor, and modified according to the present invention by changes in the output transistor, thus alters the operating conditions of the input transistor in close correspondence with the operating conditions of the output transistor to maintain a substantially static ratio of output to input current over a wide dynamic operating range.

What is claimed is:

1. A current mirror circuit comprising:
   an input transistor of one conductivity type having a collector connected to receive supply voltage and a base coupled to receive input current, and having an emitter;
   an output transistor of opposite conductivity type having a base connected to the emitter of the input transistor and having a collector connected to supply output current, and having an emitter coupled to receive supply voltage;
   a current source coupled to the emitter of the input transistor and including first and second transistors of complementary conductivity types, each transistor including base, emitter and collector, with the collector of the first transistor of same conductivity type as the input transistor connected to the emitter thereof, and with the base of the first transistor connected to the emitter of the second transistor;
   means supplying substantially fixed bias voltage relative to the supply voltage to the base of the second transistor and to the emitter of the first transistor;
   means supplying bias current to the common connection of the base of the first transistor and the emitter of the second transistor; and
   unity gain means coupling the collector of the output transistor and the collector of the second transistor for selectively altering the current in the collector of the first transistor supplied to the emitter of the input transistor.

2. The current mirror circuit according to claim 1 comprising:
   a first resistor connecting the base of the input transistor to receive the supply voltage; and a second resistor connecting the emitter of the output transistor to receive the supply voltage for controlling the ratio of output current to input current substantially as the ratio of the resistance of the second resistor to the resistance of the first resistor.

3. The current mirror circuit according to claim 1 wherein the means for supplying bias voltage is connected to supply voltage relative to the supply voltage.

* * * * *